United States Patent
Schreiber

(10) Patent No.: US 8,625,373 B2
(45) Date of Patent: Jan. 7, 2014

(54) VOLTAGE SHIFTING SENSE AMPLIFIER FOR SRAM VMIN IMPROVEMENT

(75) Inventor: Russell J. Schreiber, Austin, TX (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 70 days.

(21) Appl. No.: 13/324,550

(22) Filed: Dec. 13, 2011

(65) Prior Publication Data

US 2013/0148452 A1 Jun. 13, 2013

(51) Int. Cl.
*G11C 7/00* (2006.01)

(52) U.S. Cl.
USPC .......................................... 365/205; 365/203

(58) Field of Classification Search
USPC ................................................ 365/203, 205
See application file for complete search history.

(56) References Cited

U.S. PATENT DOCUMENTS

| | | | | |
|---|---|---|---|---|
| 6,141,259 A | * | 10/2000 | Scott et al. | 365/189.06 |
| 7,889,574 B2 | * | 2/2011 | Byeon et al. | 365/189.06 |
| 8,339,872 B2 | * | 12/2012 | Yun et al. | 365/189.11 |
| 2004/0233754 A1 | * | 11/2004 | Kwon | 365/205 |
| 2011/0133809 A1 | * | 6/2011 | Goel et al. | 327/307 |
| 2011/0141830 A1 | * | 6/2011 | Chi et al. | 365/189.11 |
| 2012/0275251 A1 | * | 11/2012 | Jin et al. | 365/203 |

OTHER PUBLICATIONS

Suzuki, T., et al. "ISSCC 2005/Session 26/Static Memory/26.6," 2005 IEEE International Solid-State Circuits Conference, 2005, pp. 484-485 and 612.

* cited by examiner

*Primary Examiner* — Son Mai
(74) *Attorney, Agent, or Firm* — Abel Law Group, LLP

(57) ABSTRACT

A sense amplifier for a SRAM device includes a PMOS differential pair and an NMOS differential pair to support operation with bit line precharge voltage as low as a few hundred millivolts without performance degradation, and generates a full rail output signal without any additional level shifter circuits. The PMOS differential amplifier includes tail current device coupled to a voltage higher than the bit line precharge voltage, and the NMOS differential amplifier includes tail current device coupled to a voltage lower than the bit line precharge voltage.

18 Claims, 5 Drawing Sheets

US 8,625,373 B2

VOLTAGE SHIFTING SENSE AMPLIFIER FOR SRAM VMIN IMPROVEMENT

BACKGROUND

1. Field of the Invention

The present invention relates to sense amplifier circuits for memory devices, and more particular relates to sense amplifier circuits for static random access memory (SRAM) integrated circuit devices.

2. Description of the Related Art

FIG. 1 illustrates a block diagram for an SRAM memory device 100. A memory array 102 includes a plurality of word lines 105 (also frequently referred to as "row lines" or "rows") and a plurality of complementary bit line pairs 110 (also frequently referred to as "column lines" or "columns"). One such word line 132 is shown, which is also labeled as WLx. One such complementary bit line pair 136, 134 is shown, which includes a true bit line 136 (also labeled as BLxT) and a complement bit line 134 (also labeled as BLxC). The memory array 102 includes a plurality of memory cells (such as memory cell 130) each coupled to an associated word line (such as word line 132) and coupled to an associated complementary bit line pair (such as bit line pair 136, 134).

A row decoder 104 receives and decodes a plurality M of row addresses 106 to generate the plurality $2^M$ of word lines 105, one of which is selected and driven to an active level during a memory operation (e.g., a read or write), and the remaining word lines are unselected and driven or maintained at an inactive level. The word line 130 may be viewed as the selected word line, which is typically driven to an active level equal to the VDD voltage, while unselected word lines 105 are typically held at an inactive level equal to the ground reference voltage (i.e., typically "held at ground").

A column decoder and multiplexer 112 receives and decodes a plurality N of column addresses 108 to select one or more of the plurality $2^N$ of complementary bit line pairs 110, and couple the selected bit line pairs via interconnections 113 to a group of sense amplifiers 114. In a read operation, the respective output from each sense amplifier 114 is coupled via interconnections 116 to a respective one of a group of input/output circuits 118 to drive the respective inputs/outputs 120. In a write operation, data to be written is presented to the inputs/outputs 120, buffered by the input/output circuits 118 and conveyed to the sense amplifiers/write drivers 114, and coupled through the column decoder and multiplexer 112 to the one or more selected complementary bit line pairs 110.

A control circuit 122 serves to control the operation of the various components of the SRAM memory device 100 in its various modes of operation, such as a read mode, a write mode, and a standby mode, in response to one or more control signal inputs (not shown).

Referring now to FIG. 2, a common six-transistor CMOS memory cell 130, and a traditional sense amplifier 114 are shown for such a SRAM memory device 100. The memory cell 130 includes a pair of cross-coupled inverters, and a pair of passgate transistors (also known as "access transistors"). One such inverter is formed by P-channel transistor 144 and N-channel transistor 146, and the other inverter is formed by P-channel transistor 145 and N-channel transistor 147. The two cross-coupled nodes 141, 143 are coupled respectively to bit lines 136, 134 by respective access transistors 140, 142 whose gate terminals are coupled to the word line 132.

If selected in a read mode of operation, the bit line pair 136, 134 is coupled through the column multiplexer 112 to nodes 152, 154 of sense amplifier 114. The three P-channel transistors 164, 165, 166 together form an equilibration circuit to equilibrate the internal sense amplifier nodes 154, 156 and to precharge both such nodes to VDD when enabled by an active-low precharge signal PCX conveyed on node 168.

Transistors 156, 158, 160, 162, 163 together form a latching differential amplifier which is enabled by asserting an active-high enable signal SAEN on node 172. Since the internal sense amplifier nodes 152, 154 are equilibrated to VDD between sensing operations, when sensing begins both P-channel transistors 156, 158 are turned off. The two N-channel transistors 160, 162 form a differential pair, and transistor 163 serves to provide the tail current for transistors 160, 162. The sense amplifier node 152, 154 having the lower voltage (as a result of the data state of memory cell 130) is driven to ground, and the other sense amplifier node 152, 154 having the higher voltage is driven to (or maintained at) VDD.

When bit lines are precharged to a relatively "high" VDD voltage, a selected memory cell may experience a read stability failure due to the voltage divider formed by the passgate transistor and the inverter pull-down transistor in the bitcell. For example, if a logic "1" is stored in the memory cell 130, internal bitcell node 141 is high (VDD) and internal bitcell node 143 is low (ground). Both bit lines 136, 134 are precharged to VDD before the read operation begins. When the selected word line 132 is driven to VDD, transistors 142 and 147 form a voltage divider that tends to raise the voltage of internal node 143 from ground to a voltage higher than ground, since the gate terminals of both transistors 142 and 147 are at VDD, the drain terminal of transistor 142 is at VDD, and the source terminal of transistor 147 is at ground. Node 143 may easily rise in voltage to a significant fraction of the VDD voltage, depending upon the ratio of transistors 142 and 147. If the voltage of node 143 is raised high enough, it may cause instability in the cross-coupled latch and cause the memory cell 130 to flip states, thereby causing an error in the memory array.

However, if bit lines are precharged to a voltage lower than VDD, the common-mode voltages of the true and complement sense amplifier nodes (which largely follows the common-mode voltage of the selected bit line pair) may be too low to "steer" the N-channel differential amplifier (i.e., transistors 160, 162, and 163) when enabled by the SAEN signal, or at best may cause the N-channel differential amplifier to function very slowly. In addition, a short-circuit current (i.e., "crowbar" current) may flow through the sense amplifier output inverters as a result of the non-rail input voltage of such inverters. In this context, VDD is the voltage to which the selected word line is driven, and which is used to power the memory cells in the array.

As process technology improvement has steadily reduced the critical line widths and feature sizes, the VDD operating window has become smaller, and proper circuit operation has become more difficult to obtain.

SUMMARY OF EMBODIMENTS OF THE INVENTION

Precharging bit lines in an SRAM to a voltage lower than VDD (e.g., between VDD and VDD-$V_{TN}$ of the memory cell passgate transistors) can dramatically improve the read stability dependent $V_{MIN}$ of the memory cell. However, doing so has historically caused sense amplifier problems because the common-mode bit line voltage is too low and causes the sense amplifier circuit to malfunction, or function very slowly.

An improved sense amplifier for a SRAM device includes a PMOS differential pair and an NMOS differential pair to support operation with bit line precharge voltage as low as a few hundred millivolts without performance degradation, and generates a full rail output signal without any additional level shifter circuits. The PMOS differential amplifier includes tail current device coupled to a voltage higher than the bit line precharge voltage, and the NMOS differential amplifier includes tail current device coupled to a voltage lower than the bit line precharge voltage.

In one aspect, the invention provides a sensing circuit. An exemplary sensing circuit includes a first sense amplifier circuit that includes: a cross-coupled pair of PMOS transistors cross-coupling a first node and a second node to a PMOS common-source node; a cross-coupled pair of NMOS transistors cross-coupling the first node and the second node to an NMOS common-source node; a precharge circuit configured to precharge the first and second nodes to a first voltage; a PMOS tail transistor responsive to an active-low sense enable signal and coupling the PMOS common-source node to a second voltage higher in magnitude than said first voltage; and an NMOS tail transistor responsive to an active-high sense enable signal and coupling the NMOS common-source node to a third voltage lower in magnitude than said first voltage.

In another aspect, the invention provides a computer-readable storage medium encoding of such a sensing circuit.

In another aspect, the invention provides a memory device including such a sensing circuit.

In another aspect, the invention provides a method for sensing a differential signal in a SRAM device. An exemplary method includes: precharging a first node and a second node to a first voltage; then developing a differential signal on the first and second nodes; then enabling a tail current for a cross-coupled PMOS differential transistor pair coupled to the first and second nodes, to drive a common source node of the cross-coupled PMOS differential transistor pair toward a second voltage higher than the first voltage; and enabling a tail current for a cross-coupled NMOS differential transistor pair coupled to the first and second nodes, to drive a common source node of the cross-coupled NMOS differential transistor pair toward a third voltage lower than the first voltage; wherein the cross-coupled PMOS differential transistor pair and the cross-coupled NMOS differential transistor pair cooperate to drive one of the first and second nodes to the second voltage, and the other of the first and second nodes to the third voltage.

In another aspect, the invention provides a method for making an integrated circuit product that incorporates a sensing circuit. An exemplary method includes: providing a first sense amplifier circuit comprising: a cross-coupled pair of PMOS transistors cross-coupling a first node and a second node to a PMOS common-source node; a cross-coupled pair of NMOS transistors cross-coupling the first node and the second node to an NMOS common-source node; a precharge circuit configured to precharge the first and second nodes to a first voltage; a PMOS tail transistor responsive to an active-low sense enable signal and coupling the PMOS common-source node to a second voltage higher in magnitude than said first voltage; and an NMOS tail transistor responsive to an active-high sense enable signal and coupling the NMOS common-source node to a third voltage lower in magnitude than said first voltage.

The inventive aspects described herein are specifically contemplated to be used alone as well as in various combinations. The invention in several aspects is contemplated to include circuits (including integrated circuits), related methods of operation, methods for making such circuits, systems incorporating same, and computer-readable storage media encodings of such circuits and methods and systems, all as described herein in greater detail and as set forth in the appended claims.

The foregoing is a summary and thus contains, by necessity, simplifications, generalizations and omissions of detail. Consequently, those skilled in the art will appreciate that the foregoing summary is illustrative only and is not intended to be in any way limiting of the invention. It is only the claims, including all equivalents, in this or any application claiming priority to this application, that are intended to define the scope of the inventions supported by this application.

BRIEF DESCRIPTION OF THE DRAWINGS

The use of the same reference symbols in different drawings indicates similar or identical items.

DETAILED DESCRIPTION

Figure 1:
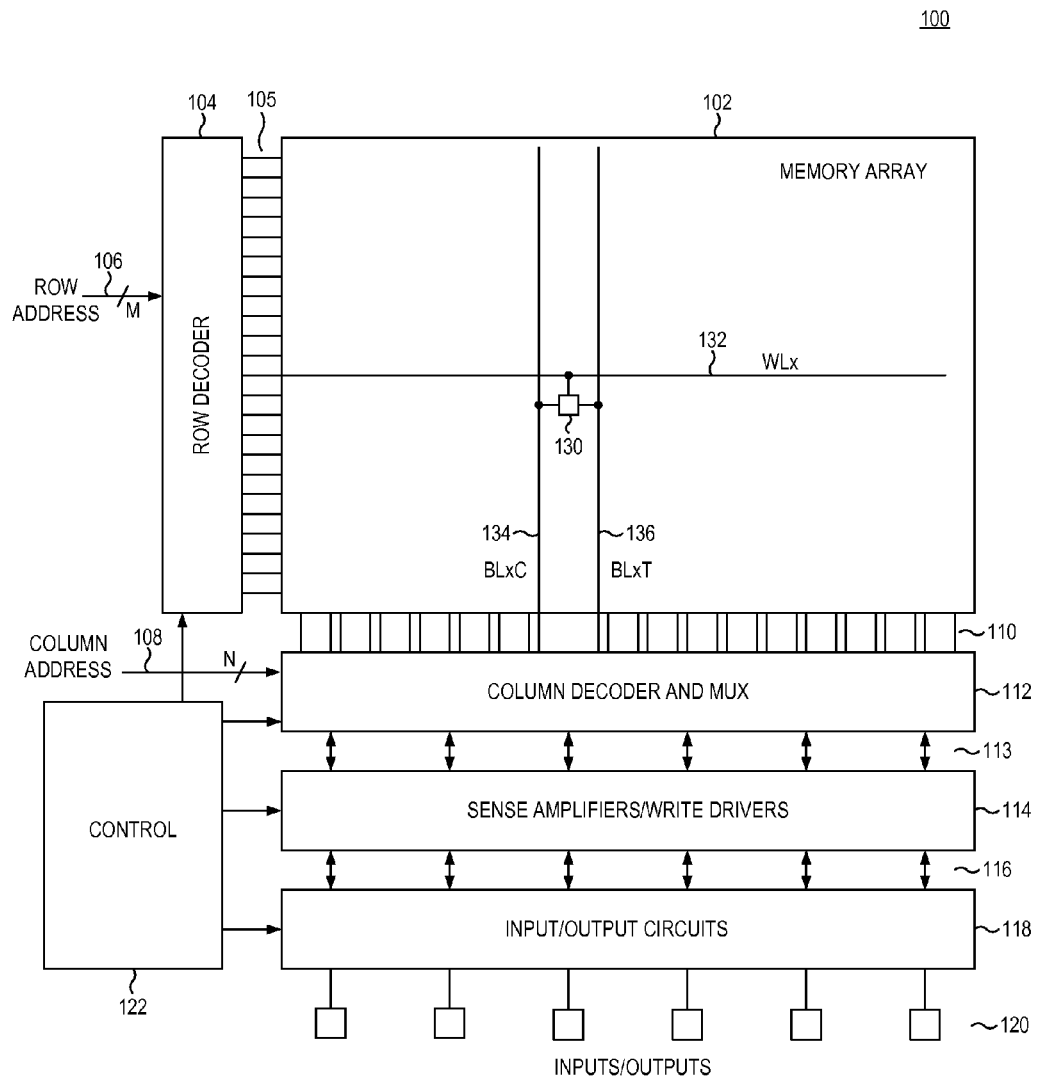
FIG. 1, labeled prior art, is a block diagram of an SRAM memory device.
Figure 2:
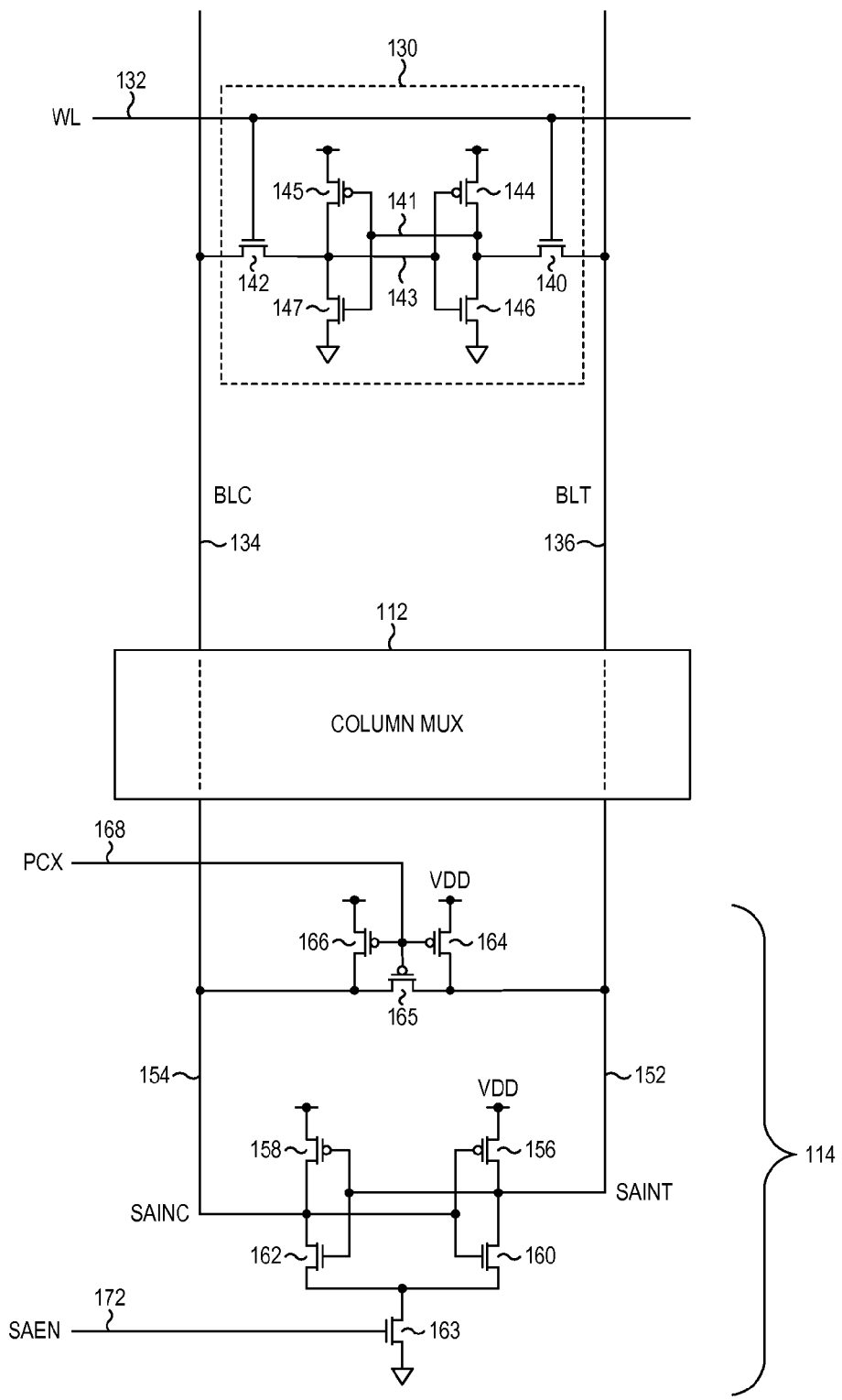
FIG. 2, labeled prior art, is a schematic diagram of a SRAM memory cell and sense amplifier.
Figure 3:
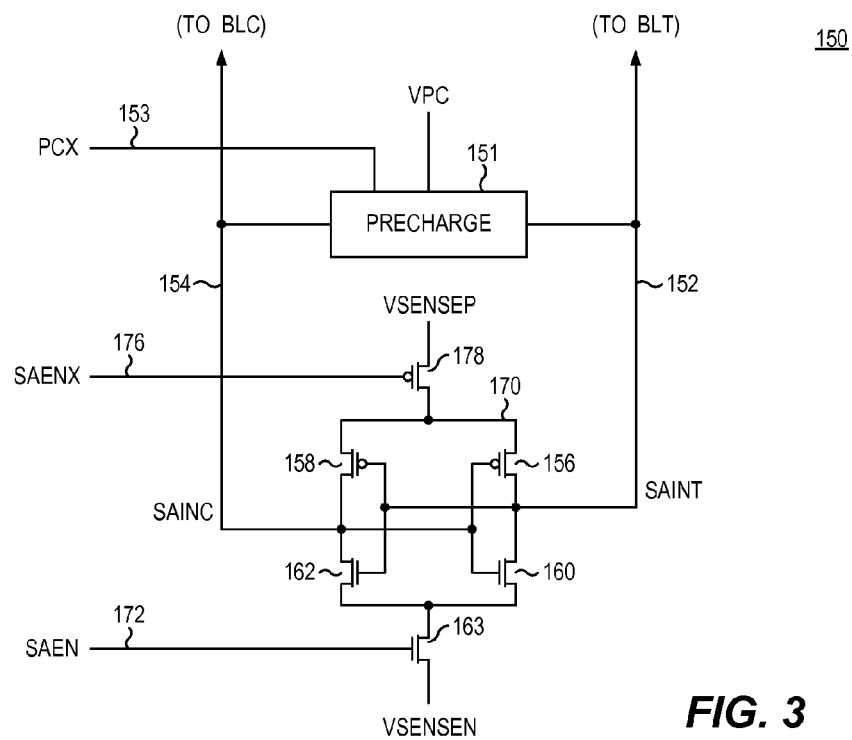
FIG. 3 is a schematic diagram of a sense amplifier in accordance with an embodiment of the present invention.

Referring now to FIG. 3, an improved sense amplifier 150 includes a P-channel "tail current" device 178 whose source terminal is coupled to a VSENSEP voltage. Such a P-channel device 178 may also be viewed as a "head current" device 178 since it is coupled to a higher voltage. A precharge circuit 151 is enabled by precharge signal PCX to precharge and equilibrate the complementary sense amplifier nodes 152, 154 to a precharge voltage VPC that is less than the VSENSEP voltage.

As before, the N-channel transistors 160, 162, 163 form a differential amplifier, with transistor 163 providing the tail current for transistors 160, 162 when enabled by the SAEN signal. However, the P-channel transistors 156, 158, 178 now form a second differential amplifier, with transistor 178 providing the tail current for PMOS transistors 156, 158 when enabled by the SAENX signal (i.e., an active-low enable signal).

Figure 4:
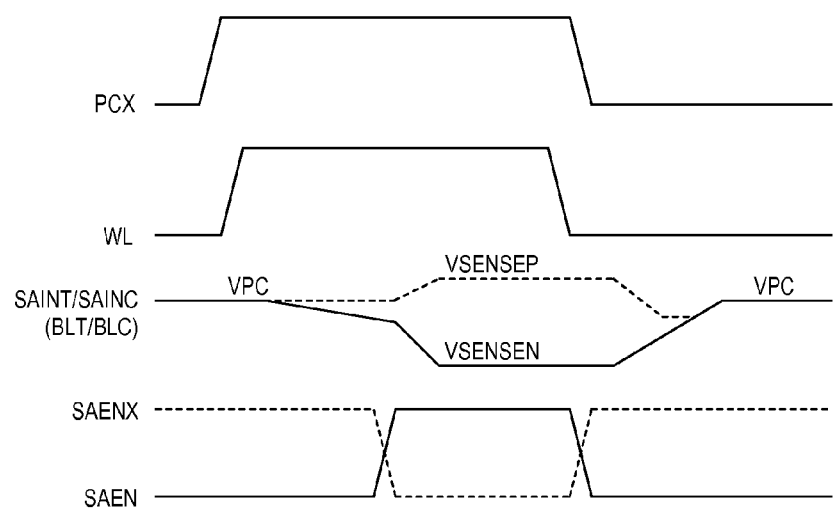
FIG. 4 is a waveform diagram illustrating the operation of the sense amplifier depicted in FIG. 3.

Operation of this circuit is illustrated by the voltage waveforms shown in FIG. 4. The internal sense amplifier nodes 152, 154 and the complementary bit lines BLT/BLC are equilibrated at the VPC voltage before a read operation begins. The precharge signal PCX is de-asserted to turn off the precharge circuit 151, then the selected word line is driven to its active voltage to cause the selected memory cell to begin to discharge one of the true or complement bit lines, and hence the true and complement sense amplifier nodes 152, 154. When the sense amplifier 150 is enabled by asserting both the active-high SAEN signal and the active-low SAENX signal, one or both of the PMOS and NMOS differential amplifiers provide gain. If the VPC voltage is relatively high (relative to the VSENSEP voltage), the respective voltages on the true and complement sense amplifier nodes 152, 154 are high enough to "steer" the N-channel differential amplifier (i.e., transistors 160, 162, and 163) with reasonable speed, but may not be low enough (relative to the VSENSEP voltage) to effectively "steer" the P-channel differential amplifier since transistors 156, 158 may be turned off (although when node 152 or 154 reaches the VSENSEN voltage, transistor 158 or 156 is turned on to drive node 154 or 152 to the VSENSEP voltage). Conversely, if the VPC voltage is relatively low (relative to the VSENSEP voltage), the respective voltages on the true and complement sense amplifier nodes 152, 154 may not be high enough to effectively "steer" the N-channel differential amplifier, but are low enough to "steer" the P-channel differential amplifier (i.e., transistors 156, 158, and 178) with reasonable speed (although when node 152 or 154 reaches the VSENSEP voltage, transistor 162 or 160 is turned on to drive node 154 or 152 to the VSENSEN voltage). Consequently, the sense amplifier 150 functions as a latching amplifier that also includes a voltage shift function. In other words, the internal sense amplifier nodes 152, 154 are established at an intermediate voltage (relative to VSENSEP and VSENSEN), but during sensing the sense amplifier node having the higher voltage is driven to the VSENSEP voltage, and the sense amplifier node having the lower voltage is driven to the VSENSEN voltage.

The SAEN and SAENX signals are preferably asserted at about the same time so that, to amplify the differential voltage between the internal sense amplifier nodes 152, 154, there is both a path to VSENSEN through the NMOS differential amplifier and a path to VSENSEP through the PMOS differential amplifier. In some embodiments, the VSENSEP voltage may be the VDD voltage, the VSENSEN voltage may be ground, and the VPC voltage may be an intermediate voltage between VDD and ground. In certain embodiments, the VPC voltage may be the VDD voltage, the VSENSEN voltage may be ground, and the VSENSEP voltage may be a voltage greater than VDD, such as boosted voltage from a charge pump, or from another external power supply.

Figure 5:
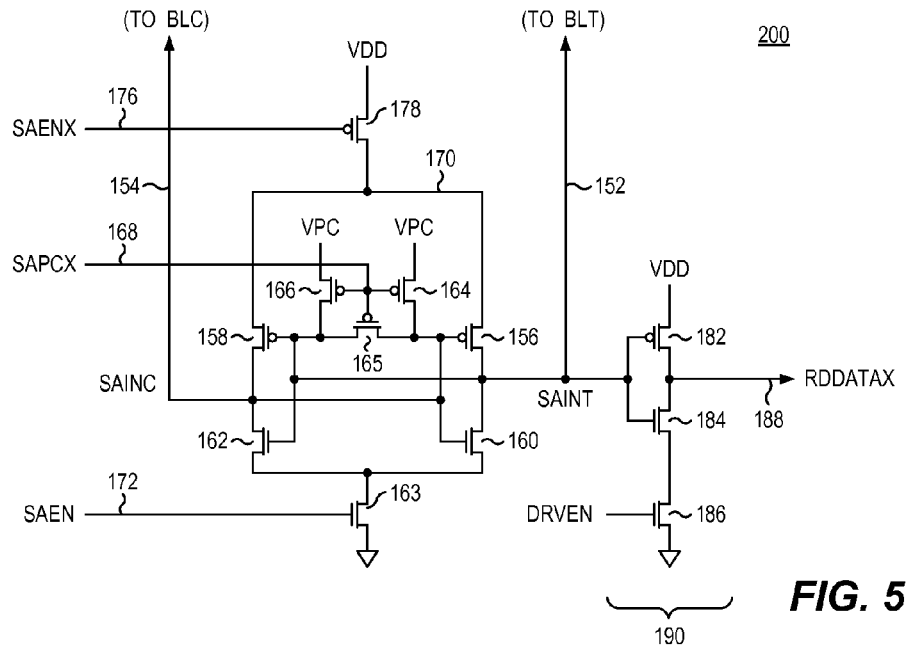
FIG. 5 is a schematic diagram of a sense amplifier in accordance with an embodiment of the present invention.

Referring now to FIG. 5, a sense amplifier 200 is shown in which the VSENSEP voltage is VDD, the VSENSEN voltage is ground, and the VPC voltage is an intermediate voltage between VDD and ground. The P-channel transistors 164, 165, 166 form a precharge circuit enabled by an active-low sense amplifier precharge signal SAPCX. A driver circuit 190 includes an inverter circuit 182, 184 that is enabled by an active-high driver enable signal DRVEN coupled to transistor 186, to drive an output node 188 with a complement read data signal RDDATAX. The DRVEN signal may be asserted when the SAEN/SAENX signals are asserted, or slightly after the sense amplifier enable signals are asserted. This prevents the mid-rail voltage of the sense amplifier nodes from causing a current spike (i.e., a "crowbar current") through the inverter 182, 184 by enabling the driver circuit no earlier than a full-rail signal is developed on the sense amplifier node 152. It may be appreciated that such a driver circuit 190 could alternatively be coupled to the complement sense amplifier node 154 to drive an output node 188 with a true read data signal RDDATA (not shown).

Figure 6:
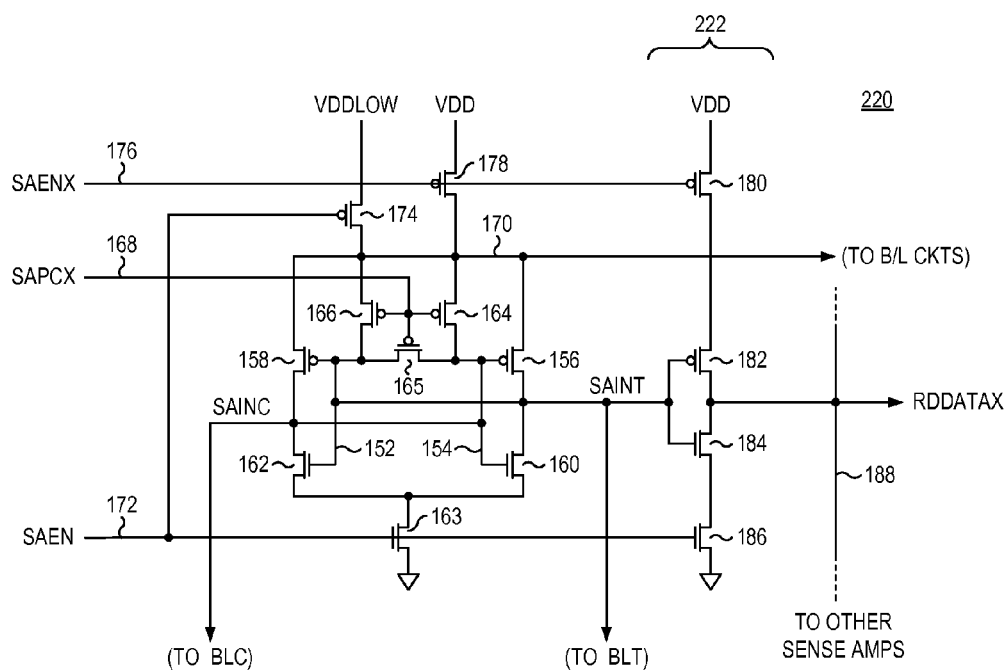
FIG. 6 is a schematic diagram of a sense amplifier in accordance with an embodiment of the present invention.

Referring now to FIG. 6, a sense amplifier 220 is shown in which the VSENSEP voltage is VDD, the VSENSEN voltage is ground, and the VPC voltage is an intermediate voltage between VDD and ground, in this case a VDDLOW voltage. Such a VDDLOW voltage is preferably set to a value equal to VDD-VTN (of the bitcell passgate transistor) to provide for good operating margins, although other values are also contemplated.

The precharge circuit includes a P-channel transistor 174 to precharge the common-source node 170 for the P-channel differential pair to the VDDLOW voltage, and the source terminal of transistors 164, 166 are coupled to node 170, which node forms a virtual VDD node for precharging the sense amplifier 220 as well as other bit line, multiplexer, and "keeper" circuits (not shown). The precharge transistor 174 is enabled by an inactive level on the SAEN signal, and is disabled when the SAEN signal is asserted to enable the sense amplifier 220. The remaining precharge transistors 164, 165, 166 are enabled by an active-low sense amplifier precharge signal SAPCX. Splitting these two precharge enable signals provides for independent timing control, and allows transistors 164, 165, 166 to be turned off just before the selected word line is turned on, while keeping transistor 174 turned on until the sense amplifier 220 is enabled.

A driver circuit 222 includes the inverter 182, 184 and gating transistor 186, as in the driver circuit 190 above, but also includes another gating transistor 180 to isolate the output node 188 from VDD when the driver circuit 222 is not enabled. Since the gating transistor 186 isolates the output node 188 from ground when the driver circuit 222 is not enabled, the output node 188 is thus "tri-stated" and may be connected to other sense amplifier driver circuit output nodes.

In this embodiment the driver circuit is enabled using the same enable signals as the sense simplifier itself. The active-high SAEN signal is coupled to both the gate terminal of transistor 163 and the gate terminal of transistor 186, and the active-low SAENX signal is coupled to both the gate terminal of transistor 178 and the gate terminal of transistor 180, which eliminates the necessity of routing separate driver enable signals to each sense amplifier circuit.

Figure 7:
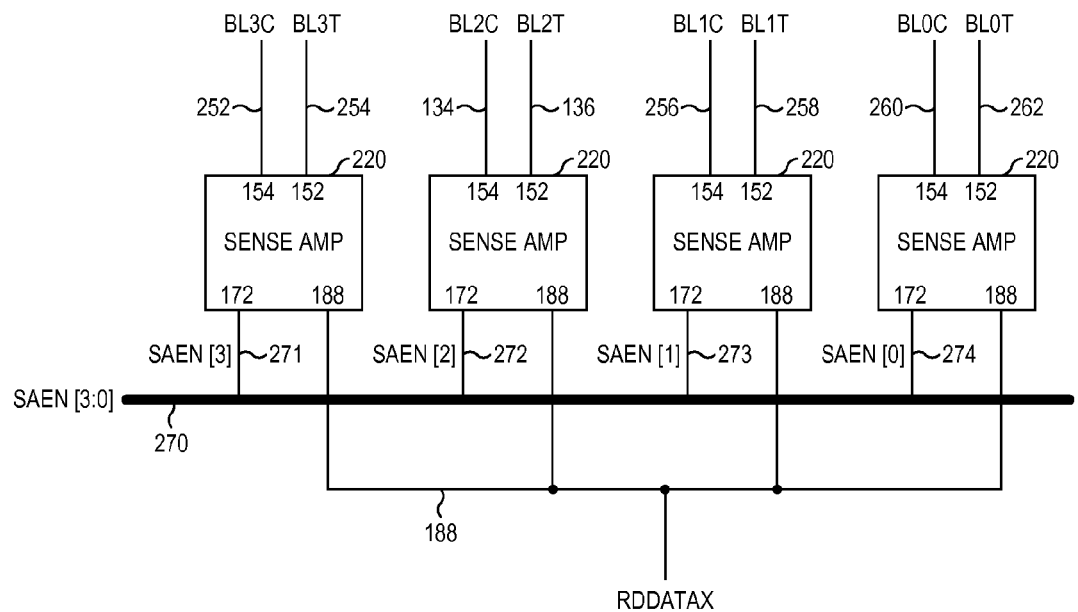
FIG. 7 is a block diagram showing a group of sense amplifiers in accordance with an embodiment of the present invention.

FIG. 7 illustrates such a tri-state arrangement 250. Four instantiations of sense amplifier 220 are shown, each for sensing a respective complementary pair of bit lines BL3C/BL3T (also labeled 252, 254), BL2C/BL2T (also labeled 134, 136), BL1C/BL1T (also labeled 256, 258), and BL0C/BL0T (also labeled 260, 262). The enable signal SAEN for each sense amplifier 220 is decoded so that, at most, only one of the four sense amplifiers is enabled at the same time, and the output node 188 is common to all four sense amplifiers. A decoded SAEN[3:0] bus 270 is shown traversing past all four sense amplifiers, but each sense amplifier receives one of the four decoded SAEN signals from this bus 270. The sense amplifier for bit lines BL3C/BL3T is enabled by SAEN[3] conveyed on bus line 271, the sense amplifier for bit lines BL2C/BL2T is enabled by SAEN[2] conveyed on bus line 272, the sense amplifier for bit lines BL1C/BL1T is enabled by SAEN[1] conveyed on bus line 273, and the sense amplifier for bit lines BL0C/BL0T is enabled by SAEN[0] conveyed on bus line 274.

For clarity, only one decoded enable signal bus 270 is shown in this figure, but it should be recognized that the bus 270 may represent an active-high decoded enable signal bus for enabling both the sense amplifier and the driver circuit, or may represent an active-low decoded enable signal bus for enabling both the sense amplifier and the driver circuit, or may represent both an active-high decoded enable signal bus and an active-low decoded enable signal bus for both the sense amplifier and the driver circuit. In embodiments which use a separate driver enable signal, the bus 270 may represent a decoded driver enable signal bus, and the one or more sense amplifier enable signals may or may not be decoded.

As used herein, a tail current serves to drive a common source node for a differential amplifier toward a bias voltage, and may provide a constant current or a non-uniform current driving the common source node to the bias voltage. A tail current may refer to either an N-channel differential amplifier or a P-channel differential amplifier, although in the case of a P-channel amplifier it may also be referred to as a "head current" (and the corresponding device also referred to as a "head current" device).

As used herein, a transistor control terminal corresponds to the gate terminal of a MOSFET. A transistor that is coupled between two nodes refers to the current-carrying terminals of the transistor rather than the control terminal, unless the context so requires. For a MOSFET, the current-carrying terminals are the source and drain terminals, which are usually viewed as being interchangeable in most low-voltage technologies. As used herein, the word "coupled" includes both directly coupled and indirectly coupled.

As used herein, a crowbar current is one that flows from one power supply node to another power supply node through a series string of devices, such as an inverter in which both the PMOS and NMOS devices are turned on. As used herein, a circuit "floats" a node thereof when no current path exists to any power rail, so that the voltage of such floating node may be driven by another circuit that has not floated that node. As used herein, references to a particular voltage may include a circuit node conveying the particular voltage. As used herein, a PMOS transistor or device is used interchangeably with a P-channel MOSFET, and an NMOS transistor or device is used interchangeably with an N-channel MOSFET.

While circuits and physical structures are generally presumed, it is well recognized that in modern semiconductor design and fabrication, physical structures and circuits may be embodied in computer readable descriptive form suitable for use in subsequent design, test or fabrication stages as well as in resultant fabricated semiconductor integrated circuits. Accordingly, claims directed to traditional circuits or structures may, consistent with particular language thereof, read upon computer readable encodings and representations of same to allow fabrication, test, or design refinement of the corresponding circuits and/or structures. The invention is contemplated to include circuits, related methods of operation, related methods for making such circuits, and computer-readable storage medium encodings of such circuits and methods, all as described herein, and as defined in the appended claims. As used herein, a computer-readable storage medium may include a disk, tape, or other magnetic, optical, semiconductor (e.g., flash memory cards, ROM), or electronic storage medium. An encoding of a circuit may include circuit schematic information, physical layout information, behavioral simulation information, and/or may include any other encoding from which the circuit may be represented or communicated.

References in the claims to a numbered item, such as a "third" transistor, are for clarity only, and do not necessarily imply that lower-numbered items of the same type are also included in the recited claim.

The foregoing detailed description has described only a few of the many possible implementations of the present invention. For this reason, this detailed description is intended by way of illustration, and not by way of limitations. Variations and modifications of the embodiments disclosed herein may be made based on the description set forth herein, without departing from the scope of the invention. It is only the following claims, including all equivalents, that are intended to define the invention.

What is claimed is:

1. A sensing circuit comprising:
   a first sense amplifier circuit comprising:
   a cross-coupled pair of PMOS transistors cross-coupling a first node and a second node to a PMOS common-source node;
   a cross-coupled pair of NMOS transistors cross-coupling the first node and the second node to an NMOS common-source node;
   a precharge circuit configured to precharge the first and second nodes to a first voltage;
   a PMOS tail transistor responsive to an active-low sense enable signal and coupling the PMOS common-source node to a second voltage higher in magnitude than said first voltage;
   an NMOS tail transistor responsive to an active-high sense enable signal and coupling the NMOS common-source node to a third voltage lower in magnitude than said first voltage; and
   a first driver circuit responsive to one of the first and second nodes and responsive to a driver enable signal, being configured to generate a read data signal on an output node when enabled by the driver enable signal, and configured to decouple the output node from one of the second voltage and the third voltage when not enabled by the driver enable signal to thereby prevent crowbar current flow irrespective of the voltage on said one of the first and second nodes.

2. The sensing circuit as recited in claim 1 wherein the precharge circuit is further configured to precharge the PMOS common-source node to the first voltage.

3. The sensing circuit as recited in claim 1
   wherein said first driver circuit is enabled only if the sense amplifier circuit is enabled.

4. The sensing circuit as recited in claim 3 wherein:
   the first driver circuit is further configured to decouple the output node from both the second voltage and the third voltage when not enabled by the driver enable signal to thereby float the output node irrespective of the voltage on said one of the first and second nodes.

5. The sensing circuit as recited in claim 4 further comprising:
   a second sense amplifier circuit comprising a second driver circuit responsive to a second driver enable signal, being configured to generate a corresponding read data signal on a second output node when enabled by the second driver enable signal, and configured to decouple the second output node from both the first voltage and the second voltage when not enabled by the second driver enable signal;
   wherein the first output node and the second output node are coupled together; and
   wherein at most only one of the first and second driver enable signals is enabled.

6. The sensing circuit as recited in claim 4 wherein the first driver circuit comprises:
   first and second PMOS transistors coupled in series between the second voltage and the output node;
   first and second NMOS transistors coupled in series between the output node and the third voltage;
   said first PMOS transistor having a gate terminal coupled to the active low sense enable signal;
   said second PMOS transistor having a gate terminal coupled to said one of the first and second nodes;
   said first NMOS transistor having a gate terminal coupled to said one of the first and second nodes;
   said second NMOS transistor having a gate terminal coupled to the active high sense enable signal; and
   wherein the driver enable signal comprises the active high sense enable signal.

7. The sensing circuit as recited in claim 2 wherein:
the precharge circuit comprises:
- a third PMOS transistor coupled between the first voltage and the PMOS common source node, having a gate terminal coupled to a first active low precharge signal;
- a fourth PMOS transistor coupled between the PMOS common source node and the first node, having a gate terminal coupled to a second active low precharge signal;
- a fifth PMOS transistor coupled between the PMOS common source node and the second node, having a gate terminal coupled to the second active low precharge signal; and
- a sixth PMOS transistor coupled between the first node and the second node, having a gate terminal coupled to the second active low precharge signal;
- wherein the PMOS tail transistor is coupled between the second voltage and the PMOS common source node, having a gate terminal coupled to the active low sense enable signal;
- wherein the second voltage is a VDD power supply voltage;
- wherein the third voltage is ground; and
- wherein the first voltage is an intermediate voltage between VDD and ground.

8. A computer-readable storage medium encoding of the sensing circuit recited in claim 1.

9. A memory device comprising the sensing circuit recited in claim 1.

10. A method for sensing a differential signal in a SRAM device, said method comprising:
- precharging a first node and a second node to a first voltage; then
- developing a differential signal on the first and second nodes; then
- enabling a tail current for a cross-coupled PMOS differential transistor pair coupled to the first and second nodes, to drive a common source node of the cross-coupled PMOS differential transistor pair toward a second voltage higher than the first voltage;
- enabling a tail current for a cross-coupled NMOS differential transistor pair coupled to the first and second nodes, to drive a common source node of the cross-coupled NMOS differential transistor pair toward a third voltage lower than the first voltage; and
- before enabling the aforementioned PMOS and NMOS tail currents, decoupling a driver output node from one of the second voltage and the third voltage to thereby prevent crowbar current flow irrespective of the voltage on said one of the first and second nodes;
- wherein the cross-coupled PMOS differential transistor pair and the cross-coupled NMOS differential transistor pair cooperate to drive one of the first and second nodes to the second voltage, and the other of the first and second nodes to the third voltage.

11. The method as recited in claim 10 wherein:
the first voltage and the third voltage differ by less than the threshold voltage of a memory cell passgate transistor.

12. The method as recited in claim 10 further comprising:
enabling the tail current for the cross-coupled PMOS differential transistor pair at the same time as enabling the tail current for the cross-coupled NMOS differential transistor pair.

13. The method as recited in claim 10 further comprising:
before developing the signal on the first and second nodes, precharging the common source node of the cross-coupled PMOS differential transistor pair to the first voltage.

14. The method as recited in claim 10 further comprising:
after enabling the aforementioned PMOS and NMOS tail currents, generating an output signal on the driver output node responsive to one of the first and second nodes.

15. The method as recited in claim 10 further comprising:
before enabling the aforementioned PMOS and NMOS tail currents, floating the driver output node of the driver circuit so that another sense amplifier circuit coupled to the same driver output node may drive a corresponding output signal onto the driver output node.

16. A method for making an integrated circuit product that incorporates a sensing circuit, said method comprising:
providing a first sense amplifier circuit comprising:
- a cross-coupled pair of PMOS transistors cross-coupling a first node and a second node to a PMOS common-source node;
- a cross-coupled pair of NMOS transistors cross-coupling the first node and the second node to an NMOS common-source node;
- a precharge circuit configured to precharge the first and second nodes to a first voltage;
- a PMOS tail transistor responsive to an active-low sense enable signal and coupling the PMOS common-source node to a second voltage higher in magnitude than said first voltage;
- an NMOS tail transistor responsive to an active-high sense enable signal and coupling the NMOS common-source node to a third voltage lower in magnitude than said first voltage; and
- a first driver circuit responsive to one of the first and second nodes and responsive to a driver enable signal, being configured to generate a read data signal on an output node when enabled by the driver enable signal, and configured to decouple the output node from one of the first voltage and the second voltage when not enabled by the driver enable signal to thereby prevent crowbar current flow irrespective of the voltage on said one of the first and second nodes.

17. The method as recited in claim 16 wherein:
the first driver circuit is further configured to decouple the output node from both the second voltage and the third voltage when not enabled by the driver enable signal to thereby float the output node irrespective of the voltage on said one of the first and second nodes.

18. The method as recited in claim 17 further comprising:
providing a second sense amplifier circuit comprising a second driver circuit responsive to a second driver enable signal, being configured to generate a corresponding read data signal on a second output node when enabled by the second driver enable signal, and configured to decouple the second output node from both the second voltage and the third voltage when not enabled by the second driver enable signal;
wherein the first output node and the second output node are coupled together; and
the first and second driver enable signals are decoded so that at most only one is enabled.

* * * * *